United States Patent
Mathews et al.

(10) Patent No.: US 7,745,236 B2
(45) Date of Patent: Jun. 29, 2010

(54) FLOATING GATE PROCESS METHODOLOGY

(75) Inventors: Charles Ray Mathews, Austin, TX (US); Alex Bierwag, Austin, TX (US); Stuart Litwin, Round Rock, TX (US)

(73) Assignee: Spansion LLC, Sunnyvale, CA (US)

( * ) Notice: Subject to any disclaimer, the term of this patent is extended or adjusted under 35 U.S.C. 154(b) by 680 days.

(21) Appl. No.: 11/614,767

(22) Filed: Dec. 21, 2006

(65) Prior Publication Data

US 2008/0153183 A1 Jun. 26, 2008

(51) Int. Cl.
   *H01L 21/66* (2006.01)
(52) U.S. Cl. .................. 438/14; 438/593; 257/E29.129
(58) Field of Classification Search .................... 438/14
   See application file for complete search history.

(56) References Cited

U.S. PATENT DOCUMENTS 4,623,255 A * 11/1986 Suszko ........................ 356/389
4,902,379 A * 2/1990 Rhodes ........................ 438/664
6,210,994 B1 * 4/2001 Calegari et al. ............. 438/127
6,861,005 B2 * 3/2005 Brask ............................ 216/2
2003/0214002 A1 * 11/2003 Chow et al. .................. 257/411

* cited by examiner

*Primary Examiner*—Thanh Nguyen
(74) *Attorney, Agent, or Firm*—Turocy & Watson, LLP

(57) ABSTRACT

A method of deprocessing a semiconductor structure is provided. The method involves removing a silicide layer over a second poly layer, an interpoly dielectric layer, a first poly layer, an optionally an oxide layer on a substrate. The method may further involve at least one of removing a second poly layer, removing an interpoly dielectric layer, removing a first poly layer, removing an oxide layer, and removing an unimplanted portion of a substrate. The exposed layer/portion of the semiconductor structure can be subjected to an inspection for defects and/or other characteristics. The inspection can aid in defect reduction strategies, among other things, when applied to new technology ramp, monitoring of baseline wafer starts, customer returns, etc.

19 Claims, 7 Drawing Sheets

FLOATING GATE PROCESS METHODOLOGY

TECHNICAL FIELD

The subject invention generally relates to deprocessing a semiconductor structure from the frontside of the semiconductor structure.

BACKGROUND

Semiconductors or integrated circuits (commonly called ICs, or chips) typically consist of multilevel structures. IC circuits fail due to various physical, chemical or mechanical mechanisms such as circular defects, electrical overstress, contamination, or wear out. Some failure analysis approaches and procedures require a die to be delayered down to a particular layer to locate such mechanisms. Methods of delayering a die involve mechanically abrading or polishing the die using a die holder, an abrasive, and a rotatable wheel.

Abrading and polishing the die are often problematic, time-consuming and limited in their usefulness. These problems and limitations result from instability, imprecision and lack of portability of abrading/polishing equipment. Abrading and polishing may damage underlying layers and undercut interconnect metal layers. The mechanical removal of layers can easily scratch, or embed polishing media or slurry into, underlying layers. Certain portions of the die may be abraded or polished at a faster rate, resulting in non-uniform abrading or polishing across the die. The abrading/polishing angle between the die surface and the rotatable wheel may be changed, resulting delayering only one corner of the die. While abrading and polishing the die, the die may break easily.

When more delayering is needed, the user places the die back onto the die holder for more delayering. This may introduce undesired variables in the die position, so that if the die is tilted differently or rotated from its position when previously delayered, the abrading/polishing produces undesired die surface characteristics. The lack of control results in undesired die surface characteristics, which can be detrimental to delayering analysis.

Another method for delayering the die is to use reactive ion etching. The method may produce non-planar etch results due to the in-homogeneity of the target layers. Reactive ion etching may require elevated temperatures, producing non-volatile species that can contaminate other layers.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides a method of deprocessing a semiconductor structure involving removing substantially all of a silicide layer over a second poly layer on a substrate by contacting the semiconductor structure with a silicide etchant without substantially affecting or damaging the integrity of the second poly layer and inspecting the semiconductor structure. The method may further involve at least one of removing a second poly layer, removing an interpoly dielectric layer, removing a first poly layer, removing an oxide layer, and removing an unimplanted portion of a substrate. By removing the layers/portions of the semiconductor structure, the adjacent, exposed layers/portions of the semiconductor structure can be subjected to an inspection for defects and/or other characteristics by using an inspection tool. The inspection can aid in defect reduction strategies, among other things, when applied to new technology ramp, monitoring of baseline wafer starts, customer returns, etc.

To the accomplishment of the foregoing and related ends, the invention, then, contains the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
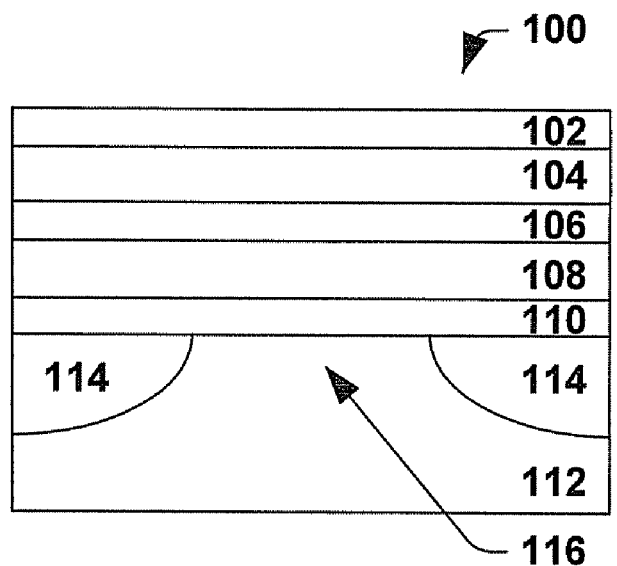
FIG. 1 illustrates a cross sectional view of a portion of an exemplary semiconductor structure in accordance with one aspect of the invention.

The subject invention provides a method of deprocessing a semiconductor structure by delayering the semiconductor structure from the frontside of the semiconductor structure. Specific, discrete layers can be removed without damaging or deleteriously affecting the adjacent layers that remain on the semiconductor structure. Consequently, inspection and testing of a deprocessed semiconductor structure can reveal details associated with fabrication that heretofore have been difficult or impossible to obtain. Since there are typically multiple successive layers on the semiconductor structure, deprocessing can be performed by removing a single layer or by removing multiple layers at one time from the top to the bottom in order to determine where the defects locate. By deprocessing a semiconductor structure, buried layers/portions otherwise difficult to examine can be exposed. This layer/portion removal is typically accomplished using either dry etching or wet etching.

The method can involve revealing/exposing a layer/portion of a semiconductor structure to allow analysis of the semiconductor structure. The revealed/exposed layer/portion of the semiconductor structure can be inspected for defects and/or other characteristics by using an inspection tool. The inspection can aid during the development and/or fabrication of new ICs, for controlling quality the manufacturing process, for failure analysis or for reverse engineering purposes.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

FIG. 1 illustrates a cross sectional view of a portion of an exemplary semiconductor structure 100 that can be subjected to the method in accordance with one aspect of the invention. The semiconductor structure 100 can contain a silicide layer 102 over a second poly layer 104, an interpoly dielectric layer 106, a first poly layer 108, and optionally an oxide layer 110 on a substrate 112. The substrate may contain at least one implanted portion 114 and at least one unimplanted portion 116. The semiconductor structure 100 can further contain other layers. For example, the semiconductor structure 100 may contain one or more of a spacer, a native oxide layer between, for example, the silicide layer 102 and the second poly layer 104, contacts and metal lines, interlayer dielectrics, dielectric isolation between devices, or the like (now shown).

Figure 2:
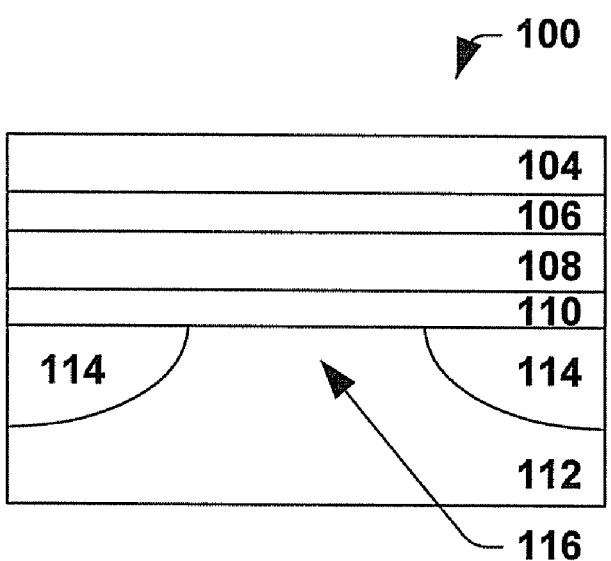
FIG. 2 illustrates removing a silicide layer from an exemplary semiconductor structure in accordance with one aspect of the invention.

FIG. 2 illustrates removing the silicide layer 102 from the exemplary semiconductor structure 100. Removing the silicide layer 102 reveals/exposes a portion of the semiconductor structure 100 such as the second poly layer 104. The revealed/exposed portion can be inspected for defects and/or other characteristics by an inspection tool. The silicide layer 102 can be removed without masking the semiconductor structure 100. When the silicide layer 102 is removed without masking the semiconductor structure 100, substantially all of the silicide layer 102 can be removed.

The silicide layer 102 contains a metal silicide. When the semiconductor structure 100 is a portion of a non-volatile memory device, the silicide layer 102 may be referred to as a gate silicide layer 102. The silicide layer 102 may be provided over at least a portion of the second poly layer 104. Example of the metal silicides include tungsten silicide, cobalt silicide, nickel silicide, titanium silicide, tantalum silicide platinum silicide, erbium silicide, palladium silicide, molybdenum silicide, zirconium silicide and the like.

The silicide layer 102 can be removed by contacting the silicide layer 102 with any suitable silicide etchant that does not substantially affect or damage the integrity of other layers in the semiconductor structure 100 such as the second poly layer 104. Examples of the silicide etchants include phosphoric acid ($H_3PO_4$). Other silicide etchants can also be used as long as they are capable of removing the silicide selective to the second poly layer 104.

The silicide etch can be self-stopping or self-terminating. Since some silicide etchants (e.g., phosphoric acid) remove silicide selectively versus an oxide, and since some silicide etchants form an oxide upon contact with polysilicon, etching the silicide automatically stops at polysilicon because an oxide layer is formed at the polysilicon layer due to contact with the silicide etchant. For example, when the silicide layer 102 is removed by the silicide etchant and an oxide layer is formed over the exposed surface of the second poly layer 104, etching is self-terminated and the second poly layer 104 is not substantially removed. However, some silicide etchants (e.g., phosphoric acid) are effective to selectively etch BPSG oxides versus silicon oxides. Therefore, some silicide etchants can etch both silicides and BPSG oxides but not etch polysilicon, permitting removal of an interlayer dielectric or an intermetal dielectric containing, for example, BPSG oxide.

Substantially all of the silicide layer 102 can be removed to allow inspection of the structure beneath the silicide layer 102 such as the second poly layer 104. In one embodiment, the silicide layer 102 is removed by contacting the silicide layer 102 with a phosphoric acid solution. The silicide layer 102 is contacted with a phosphoric acid solution under any suitable conditions to facilitate removing the silicide layer 102. The conditions depend upon, for example, the constituents of the silicide layer 102 and silicide etchant, the thickness of the silicide layer 102, and/or the configuration of the semiconductor structure 100 being deprocessed. For example, the silicide layer 102 is contacted with phosphoric acid under any suitable conditions so that the phosphoric acid can remove the silicide layer 102 without substantially affecting or damaging the integrity of other layers in the semiconductor structure 100 such as the second poly layer 104. The silicide layer 102 can be removed by contacting the silicide layer 102 with a silicide etchant with or without agitation of the silicide etchant.

By way of example, removing the silicide layer 102 using phosphoric acid is described below. Removing the silicide layer 102 using a phosphoric acid solution is typically administered by immersing the semiconductor structure 100 into the phosphoric acid solution or spraying/spreading the phosphoric acid solution over the top of the semiconductor structure 100.

The phosphoric acid solution may contain a sufficient amount of phosphoric acid to facilitate removing the silicide layer 102 from the semiconductor structure 100. In one embodiment, the phosphoric acid solution contains about 50% of phosphoric acid by weight or more and about 100% of phosphoric acid by weight or less. In another embodiment, the phosphoric acid solution contains about 70% of phosphoric acid by weight or more and about 98% of phosphoric acid by weight or less. Phosphoric acid may be diluted in water, such as de-ionized water, to produce the phosphoric acid solution having a desired concentration of phosphoric acid.

The semiconductor structure 100 is contacted with the phosphoric acid solution at a suitable temperature to facilitate removing the silicide. In one embodiment, the silicide layer 102 is contacted with the phosphoric acid solution at a temperature of about 10 degrees Celsius or more and about 100 degrees Celsius or less. In another embodiment, the silicide layer 102 is contacted with the phosphoric acid solution at a temperature of about 25 degrees Celsius or more and about 50 degrees Celsius or less. The silicide layer 102 is contacted with the phosphoric acid solution for a suitable time to facilitate removing the silicide. In one embodiment, the silicide layer 102 is contacted with the phosphoric acid solution for about 1 second or more and about 30 minutes or less. In another embodiment, the silicide layer 102 is contacted with the phosphoric acid solution for about 5 seconds or more and about 5 minutes or less.

Figure 3:
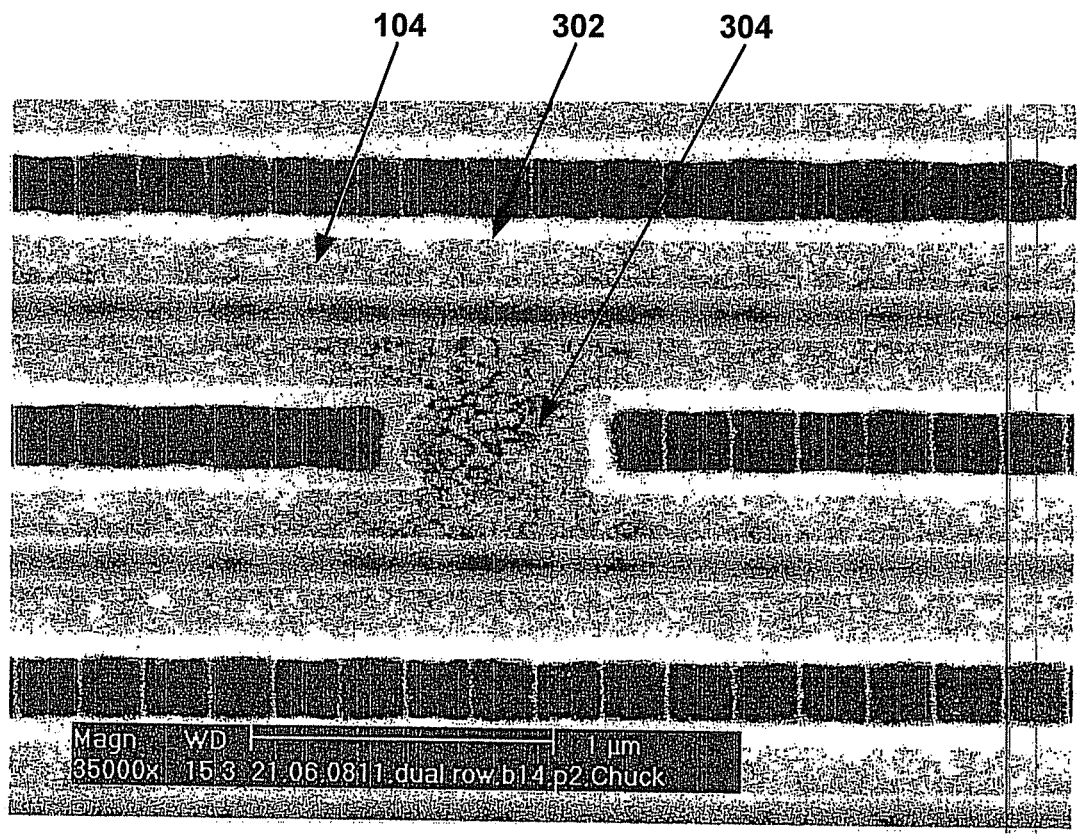
FIG. 3 shows a scanning electron microscope (SEM) picture of the surface of an exemplary semiconductor structure after removing a silicide layer in accordance with one aspect of the invention.

FIG. 3 shows a SEM picture of the surface of an exemplary semiconductor structure after removing a silicide layer. Prior to removing the silicide layer, the semiconductor structure contains the silicide layer 102 over a second poly layer 104, an interpoly dielectric layer 106, a first poly layer 108, and a spacer 302 on a substrate 112. As shown in FIG. 3, after removing the silicide layer 102, the second poly layer 104 and the spacer 302 are exposed, and a defect 304 can be detected by the SEM.

The method may or may not involve removing a native oxide layer (not shown) from a semiconductor structure 100. When a semiconductor structure 100 contains a native oxide layer, the method may involve removing a native oxide layer from a semiconductor structure 100. The native oxide layer may contain an oxide material of the second poly layer 104. Example materials of the native oxide layer include a silicon oxide. The native oxide may be naturally formed over the second poly layer 104 when the second poly layer 104 is exposed to ambient air (before the silicide layer 102 is formed during fabrication of the semiconductor structure 100).

The native oxide layer can be removed by contacting the native oxide layer with any suitable native oxide etchant that does not substantially affect or damage the integrity of other layers in the semiconductor structure 100 such as the second poly layer 104. After removing the native oxide layer, the revealed/exposed portion of the semiconductor structure 100 such as the second poly layer 104 can be inspected for defects and/or other characteristics by an inspection tool. The native oxide layer can be removed without masking the semiconductor structure 100. When the native oxide layer is removed without masking the semiconductor structure 100, substantially all of the native oxide layer can be removed.

Examples of the native oxide etchants include halogen acids such as hydrofluoric acid. In one embodiment, the native oxide etchant is a hydrofluoric acid solution such as a buffered hydrofluoric acid (BHF: e.g., hydrofluoric acid-ammonium fluoride buffered solution). In another embodiment, the native oxide etchant is a vapor of hydrofluoric acid. Other native oxide etchants can also be used as long as they are capable of removing the native oxide selective to the second poly layer 104.

Substantially all of the native oxide layer can be removed to allow inspection of the structure beneath the native oxide layer such as the second poly layer 104. The native oxide layer is contacted with the native oxide etchant under any suitable conditions to facilitate removing the native oxide layer that depend upon, for example, the constituents of the native oxide layer and native oxide etchant, the thickness of the native oxide layer, and/or the configuration of the semiconductor structure 100 being deprocessed. For example, the native oxide layer is contacted with native oxide etchant under any suitable conditions so that the native oxide etchant can remove the native oxide layer without substantially affecting or damaging the integrity of other layers in the semiconductor structure 100 such as the second poly layer 104. The native oxide layer can be removed by contacting the native oxide layer with the native oxide etchant with or without agitation of the native oxide etchant.

In one embodiment, the native oxide etchant is a BHF. By way of example, removing the native oxide layer using a BHF solution is described below. Removing the native oxide layer using the BHF solution is typically administered by immersing the semiconductor structure 100 into the BHF solution or spraying/spreading the BHF solution over the top of the semiconductor structure 100.

The BHF solution can contain a sufficient amount of hydrofluoric acid and ammonium fluoride to facilitate removing the native oxide layer from the semiconductor structure 100. In one embodiment, the BHF solution has a ratio ranging about 7:1 to about 200:1 by weight of ammonium fluoride to hydrofluoric acid. In another embodiment, the BHF solution contains about 0.0001% of hydrofluoric acid by weight or more and about 3% of hydrofluoric acid by weight or less and about 0.0007% of ammonium fluoride by weight or more and about 25% of ammonium fluoride by weight or less. Hydrofluoric acid and ammonium fluoride may be diluted in water, such as de-ionized water, to produce the BHF solution having a desired concentration of hydrofluoric acid and ammonium fluoride.

The native oxide layer is contacted with the BHF solution at a suitable temperature to facilitate removing the native oxide. In one embodiment, the native oxide layer is contacted with the BHF solution at a temperature of about 5 degrees Celsius or more and about 100 degrees Celsius or less. The native oxide layer is contacted with the BHF solution for a suitable time to facilitate removing the native oxide. In one embodiment, the native oxide layer is contacted with the BHF solution for about 10 seconds or more and about 10 minutes or less.

Figure 4:
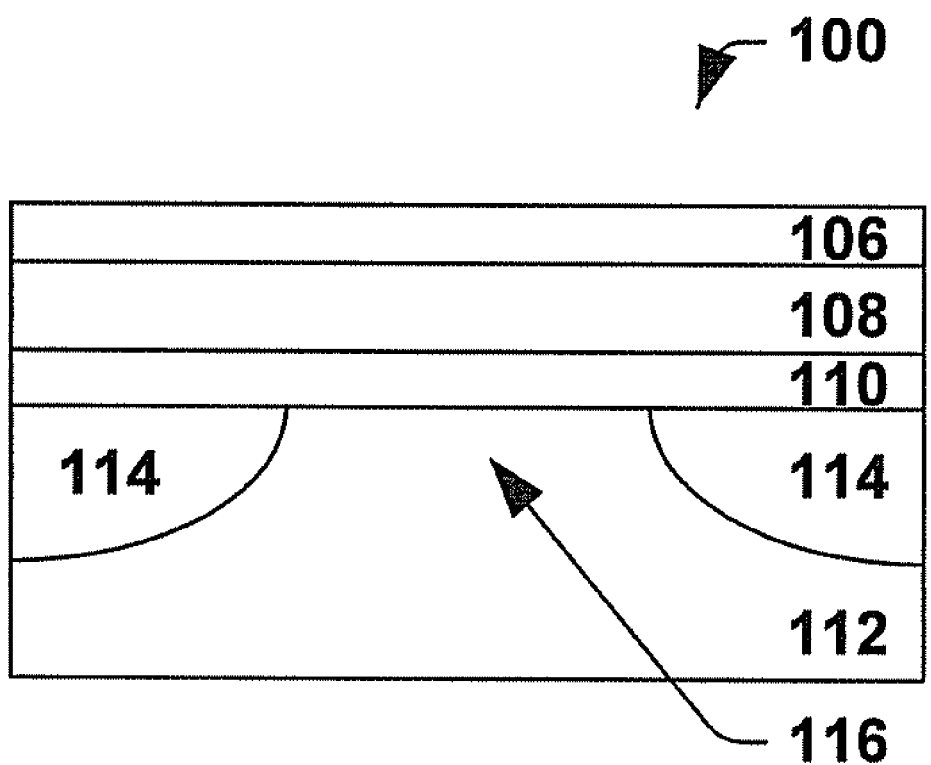
FIG. 4 illustrates removing a second poly layer from an exemplary semiconductor structure in accordance with one aspect of the invention.

FIG. 4 illustrates removing a second poly layer 104 from the exemplary semiconductor structure 100. Removing the second poly layer 104 reveals/exposes a portion of the semiconductor structure 100 such as the interpoly dielectric layer 106. The revealed/exposed portion can be inspected for defects and/or other characteristics by an inspection tool. The second poly layer 104 can be removed without masking the semiconductor structure 100. When the second poly layer 104 is removed without masking the semiconductor structure 100, substantially all of the second poly layer 104 can be removed.

The second poly layer 104 typically contains polysilicon. When the semiconductor structure 100 is a portion of a non-volatile memory device, the second poly layer 104 may be referred to as a control gate 104. The second poly layer 104 may be provided over at least a portion of the interpoly dielectric layer 106.

The second poly layer 104 can be removed by contacting the second poly layer 104 with any suitable polysilicon etchant that does not substantially affect or damage the integrity of other layers in the semiconductor structure 100 such as the interpoly dielectric layer 106. Examples of the polysilicon etchants include tetraalkylammonium hydroxides (e.g., tetramethylammonium hydroxide (TMAH)) and alkali metal hydroxides (e.g., a potassium hydroxide (KOH) and cerium hydroxide (CeOH)). Other polysilicon etchants can also be used as long as they are capable of removing the second poly layer 104 selective to the interpoly dielectric layer 106. In one embodiment, the polysilicon etchant has a selectivity of about 1,000:1 or more for polysilicon versus silicon dioxide. In another embodiment, the polysilicon etchant has a selectivity of about 5,000:1 or more for polysilicon versus silicon dioxide.

Substantially all of the second poly layer 104 can be removed to allow inspection of the structure beneath the second poly layer 104 such as the interpoly dielectric layer 106. The second poly layer 104 is contacted with a polysilicon etchant under any suitable conditions to facilitate removing the second poly layer 104 that depend upon, for example, the constituents of the second poly layer 104 and the polysilicon etchant, the thickness of the second poly layer 104, and/or the configuration of the semiconductor structure 100 being deprocessed. The second poly layer 104 can be removed by contacting the second poly layer 104 with the polysilicon etchant with or without agitation of the polysilicon etchant.

In one embodiment, the polysilicon etchant is a TMAH solution. By way of example, removing the second poly layer 104 using a TMAH solution is described below. Removing the second poly layer 104 using the TMAH solution is typically administered by immersing the semiconductor structure 100 into the TMAH solution or spraying/spreading the TMAH solution over the top of the semiconductor structure 100.

The TMAH solution may contain a sufficient amount of TMAH to facilitate removing the second poly layer 104 from the semiconductor structure 100 without substantially damaging or etching adjacent dielectric materials. In one embodiment, the TMAH solution contains about 0.5% of TMAH by weight or more and about 40% of TMAH by weight or less. In another embodiment, the TMAH solution contains about 1% of TMAH by weight or more and about 25% of TMAH by weight or less. TMAH may be diluted in water, such as de-ionized water, to produce the TMAH solution having a desired concentration of TMAH.

The second poly layer 104 is contacted with the TMAH solution at a suitable temperature to facilitate removing the second poly. In one embodiment, the second poly layer 104 is contacted with the TMAH solution at a temperature of about 20 degrees Celsius or more and about 100 degrees Celsius or less. In another embodiment, the second poly layer 104 is contacted with the TMAH solution at a temperature of about 30 degrees Celsius or more and about 60 degrees Celsius or less. The second poly layer 104 is contacted with the TMAH solution for a suitable time to facilitate removing the second poly. In one embodiment, the second poly layer 104 is contacted with the TMAH solution for about 5 seconds or more and about 20 minutes or less. In one embodiment, the second poly layer 104 is contacted with the TMAH solution for about 10 seconds or more and about 15 minutes or less. For example, the second poly layer 104 is contacted with a TMAH solution that contains about 25% of TMAH by weight, at a temperature of about 45 degrees Celsius, for about 2.5 minutes.

Figure 5:
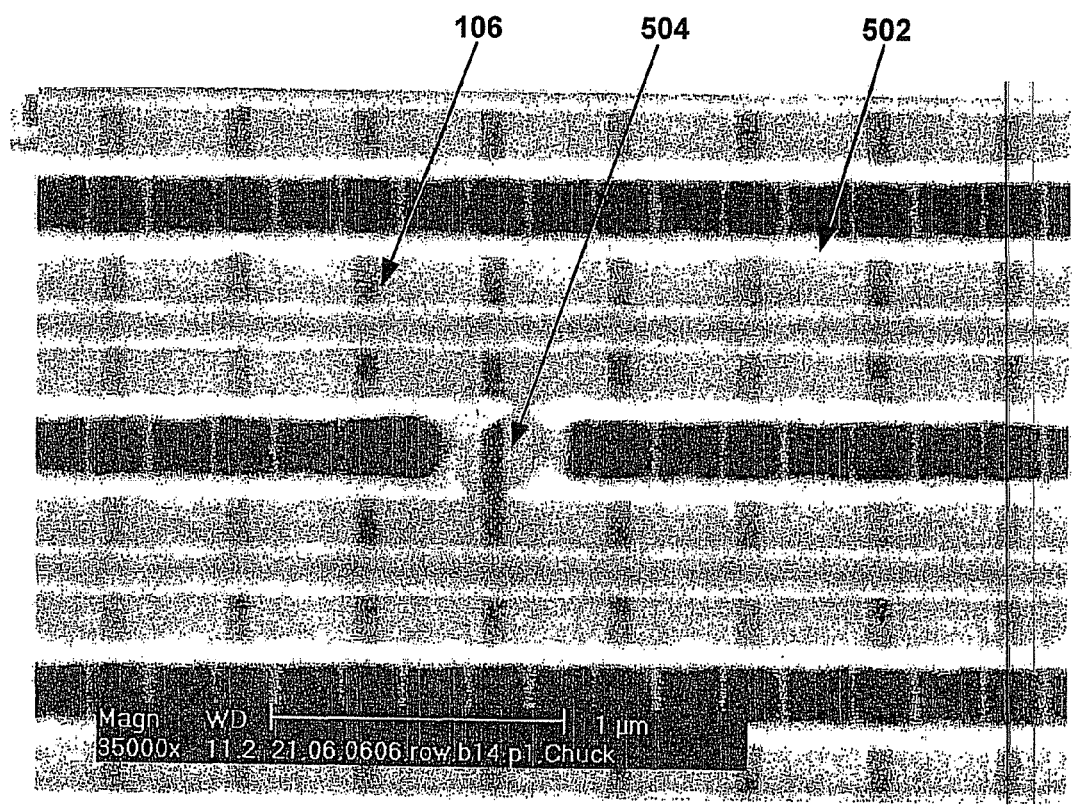
FIG. 5 shows a SEM picture of the surface of an exemplary semiconductor structure after removing a second poly layer in accordance with one aspect of the invention.

FIG. 5 shows a SEM picture of the surface of an exemplary semiconductor structure after removing a second poly layer. Prior to removing the second poly layer, the semiconductor structure contains the second poly layer 104 over an interpoly dielectric layer 106, a first poly layer 108, and a spacer 502 on a substrate 112. As shown in FIG. 5, after removing the second poly layer 104, the interpoly dielectric layer 106 and the spacer 502 are exposed, and a defect 504 can be detected by the SEM.

Figure 6:
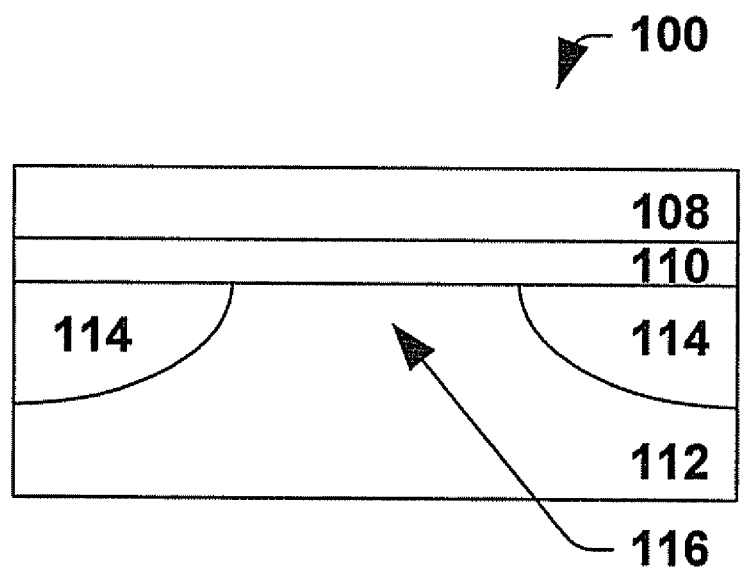
FIG. 6 illustrates removing an interpoly dielectric layer from an exemplary semiconductor structure in accordance with one aspect of the invention.

FIG. 6 illustrates removing an interpoly dielectric layer 106 from the exemplary semiconductor structure 100. Removing the interpoly dielectric layer 106 reveals/exposes a portion of the semiconductor structure 100 such as the first poly layer 108. The revealed/exposed portion can be inspected for defects and/or other characteristics by an inspection tool. The interpoly dielectric layer 106 can be removed without masking the semiconductor structure 100. When the interpoly dielectric layer 106 is removed without masking the semiconductor structure 100, substantially all of the interpoly dielectric layer 106 can be removed.

The interpoly dielectric layer 106 may contain any suitable dielectric material. Examples of the dielectric material include silicon oxide and silicon and silicon nitride. In one embodiment, the interpoly dielectric layer 106 is an oxide-nitride-oxide (ONO) tri-layer. In another embodiment, the interpoly dielectric layer 106 is an oxide-nitride (ON) bi-layer. The interpoly dielectric layer 106 may be provided over at least a portion of the first poly layer 108.

The interpoly dielectric layer 106 can be removed by contacting the interpoly dielectric layer 106 with any suitable interpoly dielectric etchant that does not substantially affect or damage the integrity of other layers in the semiconductor structure 100 such as the first poly layer 108. For multi-layered interpoly dielectrics, two or more different etchants can be used. Examples of interpoly dielectric etchants include halogen acids such as hydrofluoric acid. In one embodiment, the interpoly dielectric etchant is a hydrofluoric acid solution such as a BHF solution. In another embodiment, the interpoly dielectric etchant is a vapor of hydrofluoric acid. When the dielectric layer 114 is an ONO tri-layer containing a top oxide layer, a nitride layer and a bottom oxide layer, dilute hydrofluoric acid, phosphoric acid and dilute hydrofluoric acid can be used in sequence to remove the three layers, respectively. Other interpoly dielectric etchants can also be used as long as they are capable of removing the interpoly dielectric selective to the first poly layer 108.

Substantially all of the interpoly dielectric layer 106 can be removed to allow inspection of the structure beneath the interpoly layer 106 such as the first poly layer 108. The interpoly dielectric layer 106 is contacted with interpoly dielectric etchant under any suitable conditions to facilitate removing the interpoly dielectric layer 106 that depend upon, for example, the constituents of the interpoly dielectric layer 106 and interpoly dielectric etchant, the thickness of the interpoly dielectric layer 106, and/or the configuration of the semiconductor structure 100 being deprocessed. The interpoly dielectric layer 106 can be removed by contacting the interpoly dielectric layer 106 with the interpoly dielectric etchant with or without agitation of the interpoly dielectric etchant. The interpoly dielectric layer 106 can be removed under the conditions as described above for removing the native oxide layer.

Figure 7:
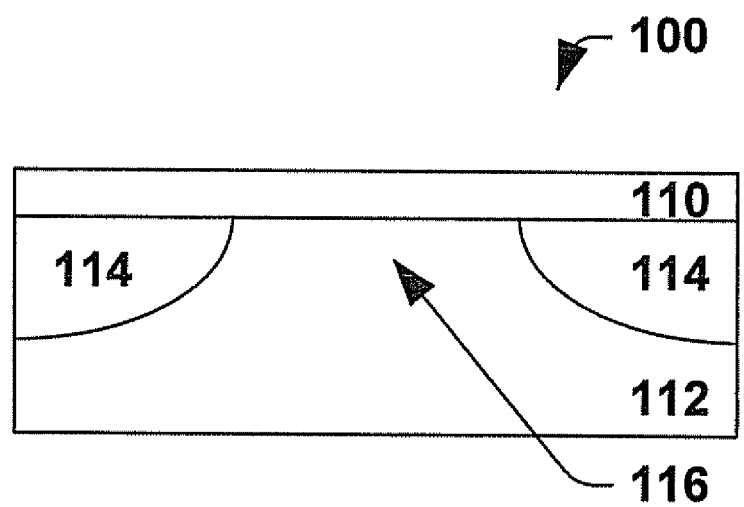
FIG. 7 illustrates removing a first poly layer from an exemplary semiconductor structure in accordance with one aspect of the invention.

FIG. 7 illustrates removing a first poly layer 108 from the exemplary semiconductor structure 100. Removing the first poly layer 108 reveals/exposes a portion of the semiconductor structure 100 such as the oxide layer 110 or substrate 112. The revealed/exposed portion can be inspected for defects and/or other characteristics by an inspection tool. The first poly layer 108 can be removed without masking the semiconductor structure 100. When the first poly layer 108 is removed without masking the semiconductor structure 100, substantially all of the first poly layer 108 can be removed.

The first poly layer 108 typically contains polysilicon. When the semiconductor structure 100 is a portion of a non-volatile memory device, the first poly layer 108 may be referred to as a floating gate 108. The first poly layer 108 may be provided over at least a portion of the oxide layer 110.

The first poly layer 108 can be removed by contacting the first poly layer 108 with any suitable polysilicon etchant that does not substantially affect or damage the integrity of other layers in the semiconductor structure 100 such as the oxide layer 110. Examples of polysilicon etchants include tetraalkylammonium hydroxides (e.g., TMAH) and alkali metal hydroxides (e.g., KOH and CeOH). Other polysilicon etchants can also be used as long as they are capable of removing the first poly layer 108 selective to the oxide layer 110.

Substantially all of the first poly layer 108 can be removed to allow inspection of the structure beneath the first poly layer 108 such as the oxide layer 110. The first poly layer 108 is contacted with a polysilicon etchant under any suitable conditions to facilitate removing the first poly layer 108 that depend upon, for example, the constituents of the first poly layer 108 and the polysilicon etchant, the thickness of the first poly layer 108, and/or the configuration of the semiconductor structure 100 being deprocessed. The first poly layer 108 can be removed by contacting the first poly layer 108 with the polysilicon etchant with or without agitation of the polysilicon etchant.

The first poly layer 108 can be removed under the conditions as described above for removing the second poly layer 104. Alternatively, in one embodiment, the TMAH solution used to etch the first poly layer 108 is at a higher temperature than the temperature of the TMAH solution to etch the second poly layer 104. In another embodiment, the TMAH solution used to etch the first poly layer 108 is about 60 degrees Celsius or more and about 80 degrees Celsius or less. For example, the first poly layer 108 is contacted with the TMAH solution that contains about 25% of TMAH by weight, at a temperature of about 70 degrees Celsius, for about 3 minutes.

Figure 8:
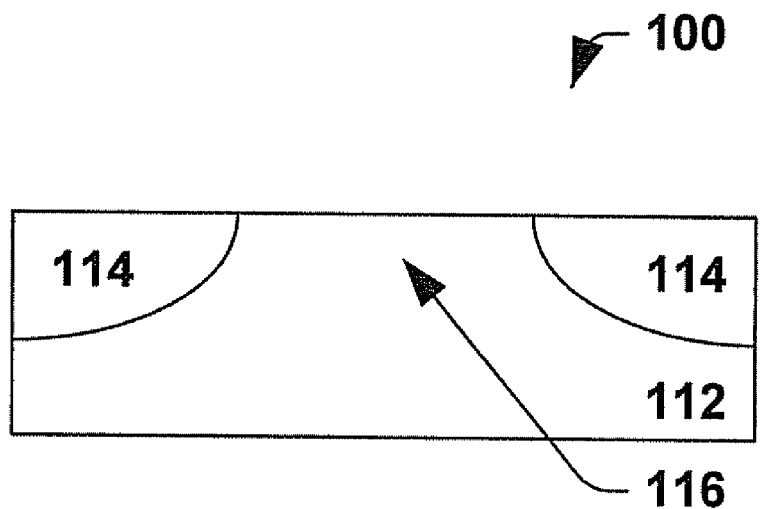
FIG. 8 illustrates removing an oxide layer from an exemplary semiconductor structure in accordance with one aspect of the invention.

FIG. 8 illustrates removing the oxide layer 110 from the exemplary semiconductor structure 100. Since the semiconductor structure 100 optionally contains the oxide layer 110, the deprocessing method may or may not involve removing the oxide layer 110 from the semiconductor structure 100. Removing the oxide layer 110 reveals/exposes a portion of the semiconductor structure 100 such as the substrate 112. The revealed/exposed portion of the semiconductor structure 100 can be inspected for defects and/or other characteristics by an inspection tool. The oxide layer 110 can be removed without masking the semiconductor structure 100. When the oxide layer 110 is removed without masking the semiconductor structure 100, substantially all of the oxide layer 110 can be removed.

The oxide layer 110 may contain any suitable oxide material. Examples of oxide materials include silicon oxide. The oxide layer 110 may be provided over at least a portion of the substrate 112. When the semiconductor structure 100 is a portion of a non-volatile memory device, the oxide layer 110 may be referred to as a tunnel oxide layer (in the core region) or a thin gate dielectric layer (in the periphery region).

The oxide layer 110 can be removed by contacting the oxide layer 110 with any suitable oxide etchant that does not substantially affect or damage the integrity of other layers/substrates in the semiconductor structure 100 such as the substrate 112. Examples of oxide etchants include halogen acids such as hydrofluoric acid. In one embodiment, the oxide etchant is a hydrofluoric acid solution. In another embodiment, the oxide etchant is a vapor of hydrofluoric acid. Other oxide etchants can also be used as long as they are capable of removing the oxide selective to the substrate 112.

Substantially all of the oxide layer 110 can be removed to allow inspection of the structure beneath the oxide layer 110 such as the substrate 112. The oxide layer 110 is contacted with oxide etchant under any suitable conditions to facilitate removing the oxide layer 110 that depend upon, for example, the constituents of the oxide layer 110 and oxide etchant, the thickness of the oxide layer 110, and/or the configuration of the semiconductor structure 100 being deprocessed. The oxide layer 110 can be removed by contacting the oxide layer 110 with the oxide etchant with or without agitation of the oxide etchant.

By way of example, removing the oxide layer 110 using hydrofluoric acid is described below. Removing the oxide layer 110 using a hydrofluoric acid solution is typically administered by immersing the semiconductor structure 100 into the hydrofluoric acid solution or spraying/spreading the hydrofluoric acid solution over the top of the semiconductor structure 100.

The hydrofluoric acid solution can contain a sufficient amount of hydrofluoric acid to facilitate removing the oxide layer 110 from the semiconductor structure 100. In one embodiment, the hydrofluoric acid solution contains about 10% of hydrofluoric acid by weight or more and about 80% of hydrofluoric acid by weight or less. In another embodiment, the hydrofluoric acid solution contains about 20% of hydrofluoric acid by weight or more and about 70% of hydrofluoric acid by weight or less.

The oxide layer 110 is contacted with the hydrofluoric acid solution at a suitable temperature to facilitate removing the oxide. In one embodiment, the oxide layer 110 is contacted with the hydrofluoric acid solution at a temperature of about 5 degrees Celsius or more and about 100 degrees Celsius or less. In another embodiment, the oxide layer 110 is contacted with the hydrofluoric acid solution at a temperature of about 10 degrees Celsius or more and about 90 degrees Celsius or less. The oxide layer 110 is contacted with the hydrofluoric acid solution for a suitable time to facilitate removing the oxide. In one embodiment, the oxide layer 110 is contacted with the hydrofluoric acid solution for about 1 second or more and about 10 minutes or less. In another embodiment, the oxide layer 110 is contacted with the hydrofluoric acid solution for about 5 second or more and about 7 minutes or less.

Figure 9:
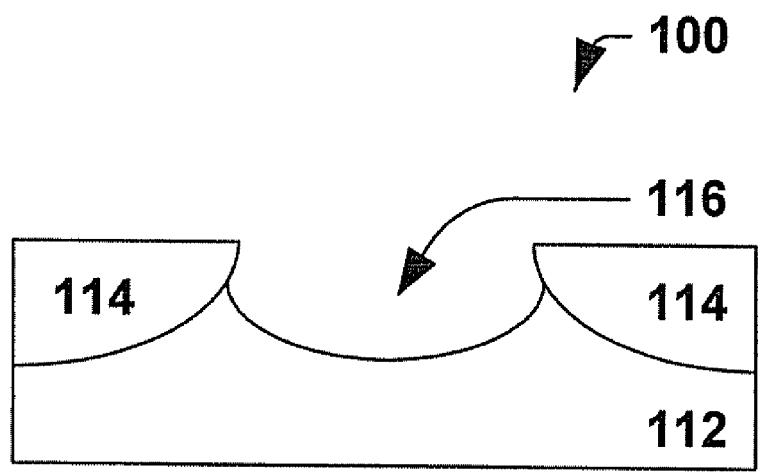
FIG. 9 illustrates removing an unimplanted portion of a substrate from an exemplary semiconductor structure in accordance with one aspect of the invention.

FIG. 9 illustrates removing an unimplanted portion 116 of the substrate 112 from the exemplary semiconductor structure 100. Removing the unimplanted portion 116 reveals/exposes a portion of the semiconductor structure 100 such as an implanted portion 114 of the substrate 112. The revealed/exposed portion of the semiconductor structure 100 can be inspected for defects and/or other characteristics by an inspection tool. The unimplanted portion 116 of the substrate 112 can be removed without masking the substrate 112.

The substrate 112 may contain any suitable substrate material on which electric device such as transistors and diodes can be formed. Examples of substrate materials include monocrystalline silicon.

The unimplanted portion 116 is a portion of the substrate 112 that is not implanted with ions. When the semiconductor structure 100 is a portion of a non-volatile memory device, the implanted portion 114 of the substrate may be referred to as a source region or drain region, and some areas of the unimplanted portion 116 of the substrate may be referred to as a channel.

The implanted potions 114 of the substrate 112 are provided by doping the substrate 112 with ions. Examples of implant species include arsenic, phosphorus, boron, argon, and the like.

The unimplanted portion 116 can be removed by contacting the substrate 112 with any suitable unimplanted substrate etchant that does not substantially affect or damage the integrity of implanted portions 114 of the substrate 112. Examples of unimplanted substrate etchants include tetraalkylammonium hydroxides such as TMAH. Other unimplanted substrate etchants can also be used as long as they are capable of removing the unimplanted portions 116 of the substrate 112 selective to the implanted portions 114 of the substrate 112.

The unimplanted substrate etchants can etch portions of the substrate 112 that are not implanted with implant species to a threshold concentration at a faster rate than the unimplanted substrate etchant etches portions of the substrate 112 that are implanted with implant species up to the threshold concentration. The exact concentration which constitutes the threshold concentration may vary in accordance with the particular etching process and the etching process parameters. Nevertheless, the portions of the substrate 112 implanted with ions beyond the threshold concentration is not substantially removed by the removal act which is selective to the implanted portion 114 of the substrate 112, and the portions of the substrate 112 implanted to less than the threshold concentration is substantially removed. In one embodiment, the threshold concentration of implanted ions of the implanted portions 114 of the substrate 112 is about $1 \times 10^{13}$ ions per $cm^2$ of substrate material (thus substrate portions containing about $1 \times 10^{13}$ ions per $cm^2$ or more are not etched by the unimplanted substrate etchant).

At least a portion of the unimplanted substrate 116 or substantially all of the unimplanted substrate 116 can be removed to allow inspection of the implanted portions 114 of the substrate 112. The substrate 112 is contacted with an unimplanted substrate etchant under any suitable conditions to facilitate removing the unimplanted portions 116 of the substrate 112 that depend upon, for example, the constituents of the substrate 112 and the unimplanted substrate etchant, the thickness of the unimplanted portions 116 of the substrate 112, and/or the configuration of the semiconductor structure 100 being deprocessed. The unimplanted portion 116 of the substrate 112 can be removed by contacting the substrate 112 with the unimplanted substrate etchant with or without agitation of the unimplanted substrate etchant.

The unimplanted portions 116 of the substrate 112 can be removed under the conditions as described above for removing the second poly layer 104. Alternatively, in one embodiment, the TMAH solution used to etch the unimplanted portions 116 is at a lower temperature than the temperature of the TMAH solution to etch the second poly layer 104. In another embodiment, the TMAH solution used to etch the unimplanted portions 116 is about 10 degrees Celsius or more and about 30 degrees Celsius or less. For example, the substrate 112 is contacted with a TMAH solution that contains about 25% of TMAH by weight, at room temperature, for about 2.5 minutes. As a result of removing the unimplanted portions 116 of the substrate 112, the implanted portions 114 of the substrate 112 along {110} plane (not shown) of the substrate 112 can be revealed.

As a layer/portion of the semiconductor structure 100 is removed, the exposed layer/portion of the semiconductor structure 100 can be subjected to an inspection by using an inspection tool. The inspection may be conducted to inspect for defects such as circular defects (e.g., short-circuit defects and open-circuit defects), measure feature sizes, and/or determine continuity of a given layer/structure. The inspection can be conducted on at least one of the native oxide layer, the second poly layer 104, the interpoly dielectric layer 106, the first poly layer 108, the metal layer; the oxide layer 110, the substrate 112, and the implanted portion 114 of a substrate 112.

The inspection can be conducted after removing one or more of the silicide layer 102, the native oxide layer, the second poly layer 104, the interpoly dielectric layer 106, the first poly layer 108, the metal layer, the oxide layer 110, or the unimplanted portion 116 of the substrate 112. For example, the second poly layer 104 is inspected after removing the silicide layer 102. In another embodiment, the interpoly dielectric layer 106 can be inspected after removing the second poly layer 104. In yet another embodiment, the first poly 108 can be inspected after removing the interpoly dielectric layer 106. In still yet another embodiment, the oxide layer 110 can be inspected after removing the first poly layer 108. In another embodiment, the substrate 112 can be inspected after removing the oxide layer 110. In yet another embodiment, the implanted portions 114 of the substrate 112 can be inspected after removing the unimplanted portion 116 of the substrate 112.

The inspection can be conducted by any suitable inspection tool. Examples of inspection tool include an optical microscope, a SEM, a Critical Dimension Scanning Electron Microscope (CD-SEM), a Field Effect Scanning Electron Microscope (FESEM), an In-Lens FESEM, a Semi-In-Lens FESEM, Transmission Electron Microscopy (TEM), Atomic Force Microscopy (AFM), and Scanning Probe Microscopy (SPM), depending on the desired magnification and precision.

In one embodiment, the inspection tool is FESEM that permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically about 0.5 kV to about 30 kV), it is able to do so without inducing extensive electrical charge in a sample semiconductor structure. In another embodiment, the defect inspection tool is In-Lens FESEM that is capable of 0.5 nm resolution at an accelerating voltage of, for example, about 30 kV.

Figure 10:
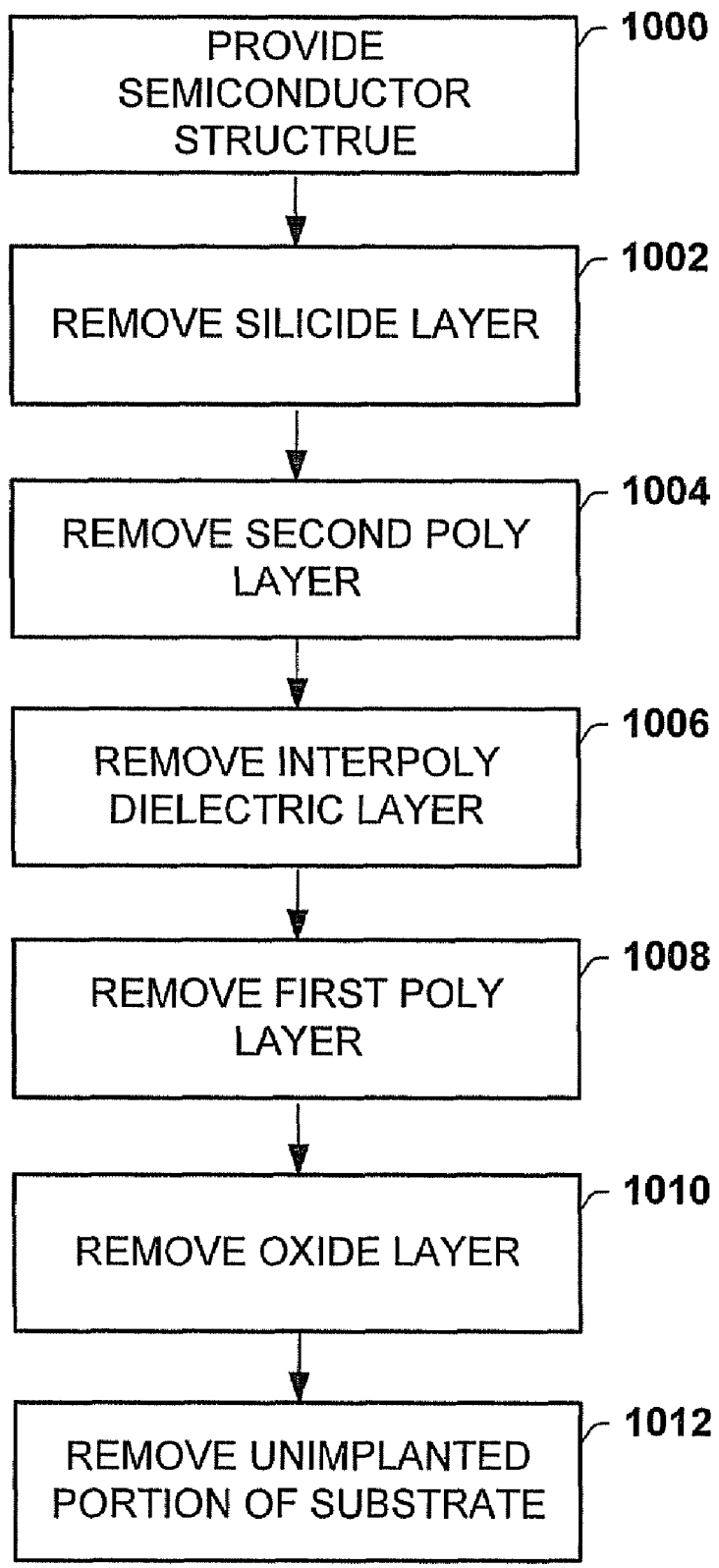
FIG. 10 illustrates a schematic block diagram of method of deprocessing a semiconductor structure in accordance with an aspect of the subject invention.

FIG. 10 illustrates an exemplary methodology of deprocessing a semiconductor structure. At 1000, a semiconductor structure is provided. The semiconductor structure can contain a silicide layer over a second poly layer, an interpoly dielectric layer, a first poly layer, and optionally an oxide layer on a substrate containing at least one implanted portion and at least one unimplanted portion. In another embodiment, the semiconductor structure can contain a silicide layer over a native oxide layer, a second poly layer, an interpoly dielectric layer, a first poly layer, a metal layer, an oxide layer on a substrate containing at least one implanted portion and at least one unimplanted portion.

At 1002, the silicide layer on the second poly layer is removed by using a suitable silicide etchant such as phosphoric acid. Removing the silicide layer may be terminated when substantially all of the silicide layer is removed. Removing the silicide layer may be terminated before the silicide etchant substantially affects or damages the integrity of other layers in the semiconductor structure such as the second poly layer.

Although not shown, optionally when the semiconductor structure contains a native oxide layer between the silicide layer and the second poly layer, the native oxide layer can be removed by using a suitable native oxide etchant such as a BHF. Removing the native oxide layer may be terminated when substantially all of the native oxide layer is removed. Removing the native oxide layer may be terminated before the native oxide etchant substantially affects or damages the integrity of other layers in the semiconductor structure such as the second poly layer.

At 1004, the second poly layer on the interpoly dielectric layer is removed by using a suitable polysilicon etchant such as TMAH. Removing the second poly layer may be terminated when substantially all of the second poly layer is removed. Removing the second poly layer may be terminated before the polysilicon etchant substantially affects or damages the integrity of other layers in the semiconductor structure such as the interpoly dielectric layer.

At 1006, the interpoly dielectric layer on a first poly layer is removed by using a suitable interpoly dielectric etchant such as a BHF. Removing the interpoly dielectric layer may be terminated when substantially all of the interpoly dielectric layer is removed. Removing the interpoly dielectric layer may be terminated before the interpoly dielectric etchant substantially affects or damages the integrity of other layers in the semiconductor structure such as the oxide layer.

At 1008, the first poly layer on the oxide layer is removed by using a suitable polysilicon etchant such as TMAH. Removing the first poly layers stops when substantially all of the first poly layer is removed. Removing the first poly layer may be terminated before the polysilicon etchant substantially affects or damages the integrity of other layers in the semiconductor structure such as the oxide layer.

At 1010, when the semiconductor structure contains an oxide layer, the oxide layer can be removed by using a suitable oxide etchant such as a HF. Removing the oxide layer may be terminated when substantially all of the oxide layer is removed. Removing the oxide layer may be terminated before the oxide etchant substantially affects or damages the integrity of other layers in the semiconductor structure such as the substrate.

At 1012, the unimplanted portion of the substrate is removed by using a suitable unimplanted substrate etchant such as TMAH. Removing the unimplanted portion of the substrate may be terminated before the unimplanted substrate etchant substantially affects or damages the integrity of implanted portion of the substrate.

Although not shown, the methodology of FIG. 10 may involve inspecting the exposed layer/portion of the semiconductor structure. The inspection may be conducted to inspect for defects such as circular defects (e.g., short-circuit defects and open-circuit defects) and/or other characteristics on at least one of the native oxide layer, second poly layer, interpoly dielectric layer, first poly layer, metal layer, oxide layer, substrate, and implanted portion of the substrate. The inspection can be conducted after removing at least one of the silicide layer; native oxide layer, second poly layer; interpoly dielectric layer; first poly layer; metal layer, oxide layer and unimplanted portion of the substrate.

The semiconductor structure 100 can be any suitable structure such as central processing units (CPUs); volatile memory devices such as DRAM devices, SRAM devices, and the like; input/output devices (I/O chips); and non-volatile memory devices such as EEPROMs, EPROMs, PROMs, and the like. The semiconductor structure 100 can be employed for substantially any electronic device such as a memory.

For example, the semiconductor structure 100 is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like. Since the semiconductor structure 100 can be employed for substantially any electronic device, the method of deprocessing the semiconductor structure 100 is useful for inspecting defects and/or other characteristics in these electronic devices.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of deprocessing a semiconductor structure comprising a silicide layer over a second poly layer, an interpoly dielectric layer, and a first poly layer on a substrate, comprising:
   removing substantially all of the silicide layer by contacting the semiconductor structure with a silicide etchant without substantially affecting or damaging an integrity of the second poly layer;
   inspecting the second poly layer
   removing substantially all of the second poly layer by contacting the semiconductor structure with a polysilicon etchant without substantially affecting or damaging an integrity of the interpoly dielectric layer comprising silicon oxide and silicon nitride;
   inspecting the interpoly dielectric layer
   removing at least a portion of or substantially all of an unimplanted substrate by contacting the semiconductor structure with an unimplanted substrate etchant without substantially affecting or damaging an integrity of an implanted portion of the substrate; and
   inspecting the implanted portion of the substrate.

2. The method of claim 1, wherein substantially all of the silicide layer is removed by contacting the semiconductor structure with phosphoric acid.

3. The method of claim 1, wherein substantially all of the second poly layer is removed by contacting the semiconductor structure with a tetraalkylammonium hydroxide.

4. The method of claim 1 further comprising:
   removing substantially all of the interpoly dielectric layer by contacting the semiconductor structure with an interpoly dielectric etchant without substantially affecting or damaging an integrity of the first poly layer; and
   inspecting the semiconductor structure.

5. The method of claim 4, wherein substantially all of the interpoly dielectric layer is removed by contacting the semiconductor structure with buffered hydrofluoric acid.

6. The method of claim 4, wherein substantially all of the interpoly dielectric layer is removed by contacting the semiconductor structure with hydrofluoric acid and phosphoric acid.

7. The method of claim 1 further comprising:
   removing substantially all of the first poly layer by contacting the semiconductor structure with a polysilicon etchant without substantially affecting or damaging an integrity of the oxide layer or the substrate; and
   inspecting the semiconductor structure.

8. The method of claim 7, wherein substantially all of the first poly layer is removed by contacting the semiconductor structure with a tetraalkylammonium hydroxide.

9. The method of claim 1 further comprising:
   removing substantially all of an oxide layer positioned adjacent the substrate by contacting the semiconductor structure with an oxide etchant without substantially affecting or damaging an integrity of the substrate; and
   inspecting the semiconductor structure.

10. The method of claim 9, wherein substantially all of the oxide layer is removed by contacting the semiconductor structure with hydrofluoric acid.

11. The method of claim 1, wherein at least the portion of or substantially all of the unimplanted substrate is removed by contacting the semiconductor structure with a tetraalkylammonium hydroxide.

12. The method of claim 1 further comprising at least one of:
   removing substantially all of a native oxide layer between the silicide layer and the second poly layer; and removing substantially all of a metal layer between the first poly layer and the oxide layer.

13. A method of deprocessing a non-volatile memory device, comprising:

removing substantially all of a silicide layer by contacting the non-volatile memory device with a silicide etchant to reveal a control gate and inspecting the control gate, removing substantially all of the control gate by contacting the non-volatile memory device with a polysilicon etchant to reveal an interpoly dielectric layer and inspecting the interpoly dielectric layer, removing substantially all of the interpoly dielectric layer comprising silicon oxide and silicon nitride by contacting the non-volatile memory device with an interpoly dielectric etchant to reveal a floating gate and inspecting the floating gate, removing substantially all of the floating gate by contacting the non-volatile memory device with a polysilicon etchant to reveal a tunnel oxide layer and inspecting the tunnel oxide layer, removing substantially all of the tunnel oxide layer by contacting the non-volatile memory device with an oxide etchant to reveal a substrate, and removing at least a portion of or substantially all of an unimplanted substrate by contacting the non-volatile memory device with an unimplanted substrate etchant to reveal an implanted portion of the substrate and inspecting the implanted portion of the substrate.

14. The method of claim 13, wherein the silicide layer, control gate, interpoly dielectric layer, floating gate, tunnel oxide layer and portion of the unimplanted substrate are removed without masking the non-volatile memory device.

15. The method of claim 13, wherein substantially all of the silicide layer is removed by contacting the semiconductor structure with phosphoric acid;

substantially all of the control gate is removed by contacting the semiconductor structure with a tetraalkylammonium hydroxide;

substantially all of the interpoly dielectric layer is removed by contacting the semiconductor structure with buffered hydrofluoric acid and phosphoric acid;

substantially all of the floating gate is removed by contacting the semiconductor structure with a tetraalkylammonium hydroxide;

substantially all of the tunnel oxide layer is removed by contacting the semiconductor structure with hydrofluoric acid; and at least the portion of or substantially all of the unimplanted substrate is removed by contacting the semiconductor structure with a tetraalkylammonium hydroxide.

16. A method of inspecting a semiconductor structure for defects and/or other characteristics, comprising:

revealing a second poly layer by removing substantially all of a silicide layer, revealing an interpoly dielectric layer by removing substantially all of the second poly layer, revealing a first poly layer by removing substantially all of the interpoly dielectric layer, revealing an oxide layer by removing substantially all of the first poly layer, revealing a substrate by removing substantially all of the oxide layer, and revealing an implanted portion of the substrate by removing at least a portion of or substantially all of an unimplanted portion of the substrate.

17. The method of claim 16, wherein inspecting the semiconductor structure is conducted using a microscope.

18. The method of 16, wherein the second poly layer, interpoly dielectric layer, first poly layer, oxide layer and portion of the unimplanted substrate are removed without masking the semiconductor structure.

19. The method of claim 16, wherein the second poly layer, the interpoly dielectric layer, the first poly layer, the oxide layer, the substrate, or the implanted portion of the substrate is inspected by detecting circular defects, measuring feature sizes, or determining continuity of the layers.

* * * * *